United States Patent [19]
Pedersen

[11] Patent Number: 5,936,425
[45] Date of Patent: *Aug. 10, 1999

[54] TRI-STATABLE INPUT/OUTPUT CIRCUITRY FOR PROGRAMMABLE LOGIC

[75] Inventor: Bruce B. Pedersen, San Jose, Calif.

[73] Assignee: Altera Corporation, San Jose, Calif.

[*] Notice: This patent is subject to a terminal disclaimer.

[21] Appl. No.: 09/096,250

[22] Filed: Jun. 11, 1998

Related U.S. Application Data

[63] Continuation of application No. 08/607,849, Feb. 27, 1996, Pat. No. 5,796,267, which is a continuation-in-part of application No. 08/442,795, May 17, 1995, Pat. No. 5,689,195.

[51] Int. Cl.[6] ................................................. H03K 19/177
[52] U.S. Cl. ................................................. 326/39; 326/37
[58] Field of Search .................. 326/37–39, 41, 326/47

[56] References Cited

U.S. PATENT DOCUMENTS

| | | |
|---|---|---|
| Re. 34,363 | 8/1993 | Freeman .................................... 307/465 |
| 3,473,160 | 10/1969 | Wahlstrom ............................ 340/172.5 |
| 4,609,986 | 9/1986 | Hartmann et al. ....................... 364/200 |
| 4,617,479 | 10/1986 | Hartmann et al. . |
| 4,642,487 | 2/1987 | Carter . |
| 4,677,318 | 6/1987 | Veenstra . |
| 4,713,792 | 12/1987 | Hartmann et al. ....................... 364/900 |
| 4,758,745 | 7/1988 | Elgamal et al. . |
| 4,774,421 | 9/1988 | Hartmann et al. . |
| 4,871,930 | 10/1989 | Wong et al. . |
| 4,879,688 | 11/1989 | Turner et al. ............................ 365/201 |
| 4,899,067 | 2/1990 | So et al. . |
| 4,912,342 | 3/1990 | Wong et al. . |
| 5,023,606 | 6/1991 | Kaplinsky ............................ 340/825.8 |
| 5,121,006 | 6/1992 | Pedersen . |
| 5,144,166 | 9/1992 | Camarota et al. . |
| 5,208,491 | 5/1993 | Ebeling et al. . |
| 5,220,214 | 6/1993 | Pedersen . |
| 5,231,312 | 7/1993 | Gongwer et al. . |
| 5,241,224 | 8/1993 | Pedersen et al. . |
| 5,258,668 | 11/1993 | Cliff et al. . |
| 5,260,610 | 11/1993 | Pedersen et al. . |

(List continued on next page.)

FOREIGN PATENT DOCUMENTS

| | | |
|---|---|---|
| 225715 | 6/1987 | European Pat. Off. . |
| WO 92/15152 | 9/1992 | WIPO . |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

*Primary Examiner*—Jon Santamauro
*Attorney, Agent, or Firm*—Fish & Neave; Robert R. Jackson; Michael E. Shanahan

[57] ABSTRACT

Each output signal of programmable logic circuitry is made programmably available to drive one or more of a plurality of tri-statable input/output pins of the circuitry. Each output signal is also made programmably available to provide the output enable signal for one or more of a multiplicity of those input/output pins. The above-mentioned plurality and multiplicity associated with each output signal may include the same or different input/output pins. Output signals may therefore be routed to the input/output pins with greater flexibility, and output enable signal options are also greatly increased.

27 Claims, 3 Drawing Sheets

OTHER PUBLICATIONS 5,260,611  11/1993  Cliff et al. .
5,274,581  12/1993  Cliff et al. ............................... 364/784
5,350,954   9/1994  Patel et al. .
5,371,422  12/1994  Patel et al. ................................ 326/41
5,384,500   1/1995  Hawes et al. ............................... 326/39
5,386,155   1/1995  Steele et al. ............................... 326/37
5,448,186   9/1995  Kawata ..................................... 326/41
5,483,178   1/1996  Costello et al. ........................... 326/41
5,504,439   4/1996  Tavana ..................................... 326/38
5,689,195  11/1997  Cliff et al. ................................ 326/41
5,796,267   8/1998  Pedersen ................................... 326/39

TRI-STATABLE INPUT/OUTPUT CIRCUITRY FOR PROGRAMMABLE LOGIC

This is a continuation of application Ser. No. 08/607,849, filed Feb. 27, 1996, now U.S. Pat. No. 5,796,267, which is a continuation-in-part of application Ser. No. 08/442,795, filed May 17, 1995, now U.S. Pat. No. 5,689,195.

BACKGROUND OF THE INVENTION

This invention relates to programmable logic circuitry, and more particularly to circuits for controlling tri-statable input/output ("I/O") terminals or "pins" in such circuitry.

Programmable logic circuitry is well known as shown, for example, by Wong et al. U.S. Pat. No. 4,871,930, Pedersen et al. U.S. Pat. No. 5,241,224, Cliff et al. U.S. Pat. No. 5,260,611, and Cliff et al. U.S. Pat. No. 5,689,195, all of which are hereby incorporated by reference herein. Such circuitry, which is generally implemented in integrated circuit devices, typically includes large numbers of input/output ("I/O") terminals or "pins." Each such I/O pin typically has a tri-statable output driver for selectively applying an output signal of the programmable logic to the I/O pin, generally so that this signal can be applied to circuitry external to the programmable logic. Thus the tri-statable output driver must receive both the output signal and a so-called output enable ("OE") signal for controlling the state of the driver. If the I/O pin is to be used as an input pin (through which the programmable logic can receive an input signal from external circuitry), the OE signal is switched to the state which causes the tri-statable output driver to block any signal from the programmable logic. In the output mode the OE signal may be used to control the timing with which the output signal is applied to the I/O pin. Thus the OE signal frequently plays an important role in relation to the associated output and/or input signals, and this role may differ for different uses of the programmable logic device or for different I/O pins of a given device.

In view of the foregoing, it is an object of this invention to provide improved circuitry for tri-statable I/O pins in programmable logic.

It is a more particular object of this invention to provide tri-statable I/O pin circuitry for programmable logic which has greater flexibility of use.

SUMMARY OF THE INVENTION

These and other objects of the invention are accomplished in accordance with the principles of the invention by providing tri-statable I/O pin circuits for programmable logic in which both the output signal and the OE signal for an I/O pin can be programmably selected from plural sources. For example, the output signal that is normally associated with each I/O pin may be programmably selectable as the output signal for either or both of that pin and another pin. More particularly, either of two output signals that are respectively normally associated with two I/O pins may be programmably selectable as the output signal for either or both of those pins. As another example, the output signal that is normally associated with each I/O pin may be programmably selectable as the OE signal for either or both of that pin and another pin. More particularly, either of two output signals that are respectively normally associated with two I/O pins may be programmably selectable as the OE signal for either or both of those pins. The preceding sentences that mention two I/O pins and in some cases two output signals also apply to groups of more than two I/O pins and groups of more than two output signals.

If desired, the OE signal for each pin may be additionally programmably selectable from other sources such as (1) one or more "global" output enable signals available on the programmable logic device, (2) a source of fixed logic 1 potential (e.g., the source of VCC potential), and/or (3) a source of fixed logic 0 potential (e.g., the source of VSS (ground) potential). Also if desired, the output signal for each pin may be additionally programmably selectable from other sources such as (1) a source of fixed logic 1 potential (e.g., VCC) and/or (2) a source of fixed logic 0 potential (e.g., VSS).

Further features of the invention, its nature and various advantages, will be more apparent from the accompanying drawings and the following detailed description of the preferred embodiments

DETAILED DESCRIPTION OF THE PREFERRED EMBODIMENTS

Figure 1:
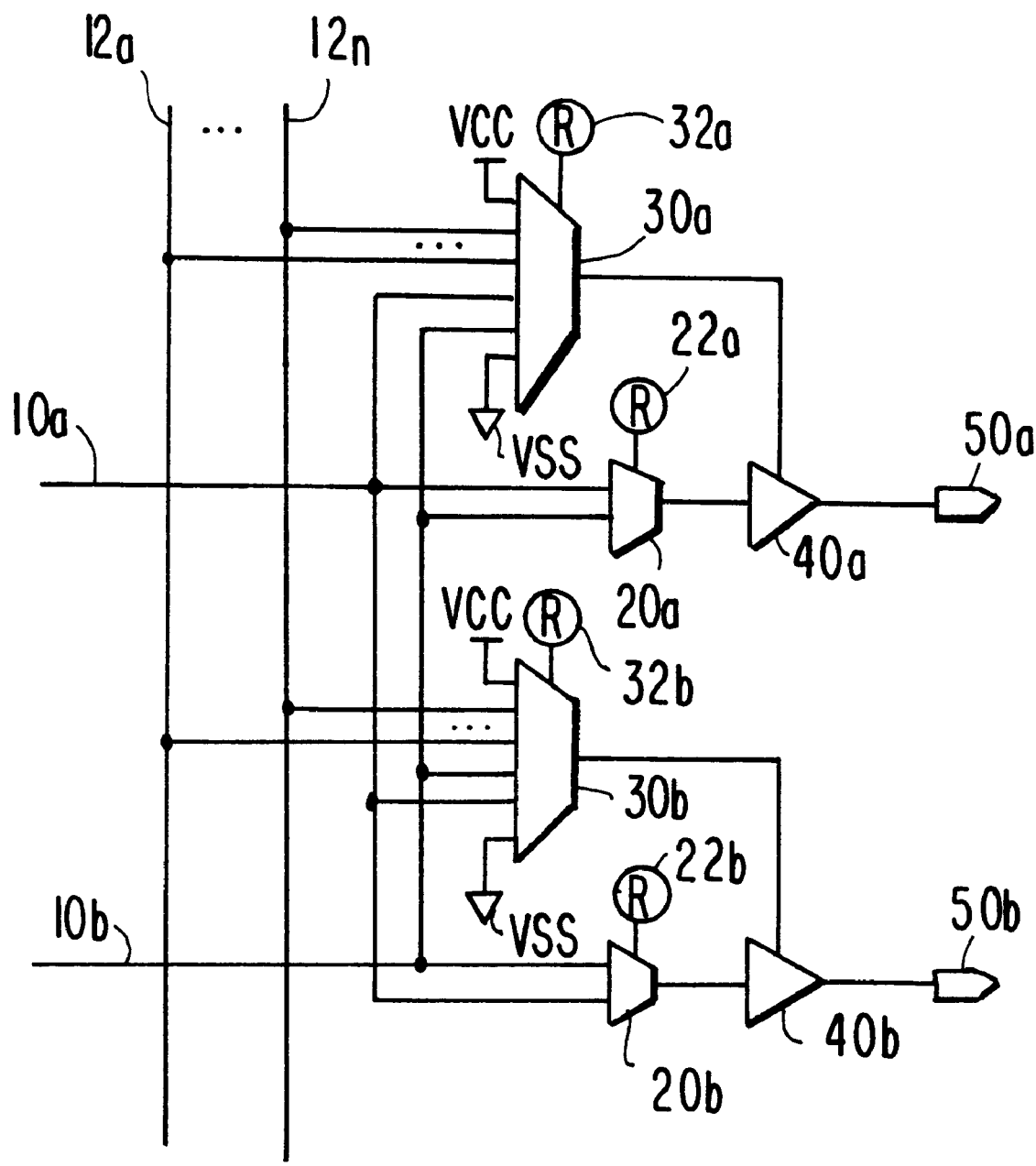
FIG. 1 is a simplified schematic block diagram of a representative portion of an illustrative embodiment of programmable logic circuitry constructed in accordance with the principles of this invention.

In the illustrative embodiment shown in FIG. 1, signals 10a and 10b are two representative output signals from other portions of the programmable logic that are not shown but that may be like circuitry shown in any of the references that are incorporated above or any other programmable logic circuitry. Each of these output signals is normally associated with a respective one of tri-state drivers 40a and 40b and a respective one of I/O pins 50a and 50b. In the particularly preferred embodiments pins 50a and 50b are physically adjacent to one another in the circuitry that implements the programmable logic. In accordance with this invention, output signals 10a and 10b are effectively paired by cross connections that will now be described.

Output signal 10a is applied to one input terminal of programmable logic connector ("PLC") 20a and to one input terminal of PLC 20b. Output signal 10b is applied to the other input terminal of each of PLCs 20a and 20b. Each of PLCs 20 is programmably controlled by an associated function control element ("FCE") 22a or 22b to connect either of its inputs to its output terminal. Thus the output signal applied to either or both of tri-state drivers 40a and 40b can be either of output signals 10a and 10b. This increases output signal routing flexibility in the device. It also makes it possible to tie two I/O pins (50a and 50b) together to provide a stronger signal (driven by two drivers 40a and 40b in parallel, rather than by only one such driver) if such a stronger signal is needed by the external circuitry that is connected to pins 50.

In addition to being applied to PLCs 20a and 20b as described above, each of output signals 10a and 10b is applied to a respective input terminal of each of PLCs 30a and 30b. Other inputs to each of PLCs 30a and 30b are one or more "global" OE signals 12a–12n. OE signals 12a–12n are typically also available to at least several, perhaps all, other I/O pin circuits on the programmable logic device. Still other inputs to each of PLCs 30a and 30b are a fixed logic 1 signal (e.g., VCC) and a fixed logic 0 signal (e.g., VSS).

Each of PLCs 30 is programmably controlled by associated FCEs 32a or 32b to connect one of its inputs to its output. The output signal of each PLC 30 is the output enable ("OE") signal of the associated tri-state driver 40. Accordingly, the OE signal of tri-state driver 40a can be either of signals 10a and 10b, any of OE signals 12a–n, VCC, or VSS. The OE signal of tri-state driver 40b can also be any of these signals.

The above-described OE circuitry affords a great deal of flexibility in providing OE functions. For example, an output signal such as 10a can be its own OE signal. Or an output signal such as 10a can have an adjacent output signal such as 10b as its OE signal. Or an output signal such as 10a can have any of global OE signals 12a–n as its OE signal. Or an OE signal can be VCC (output driver always enabled) or VSS (output driver always disabled). With this high degree of OE signal flexibility, and the ability to flexibly switch output signals 10a and 10b between or among I/O pins 50a and 50b, the I/O pin circuitry shown in FIG. 1 has the capability to meet many different needs.

Although FIG. 1 shows two output signals 10a and 10b and their associated I/O circuitry paired, it will be understood that this principle can be extended, if desired, to groups of any number of output signals and associated I/O circuitry. For example, if it were desired to group three output signals 10 in the manner shown in FIG. 1, the PLCs 20 associated with each of those output signals would have three inputs, and the PLCs 30 associated with each of those output signals would have one more input than is shown in FIG. 1. Then it would be possible to switch any of the three output signals to any of the three associated I/O pins 50. Similarly, it would be possible to use any of the three output signals as the OE signal for any of those signals (in addition to having the option to use any of OE signals 12a–n, VCC, or VSS as any OE signal).

Figure 2:
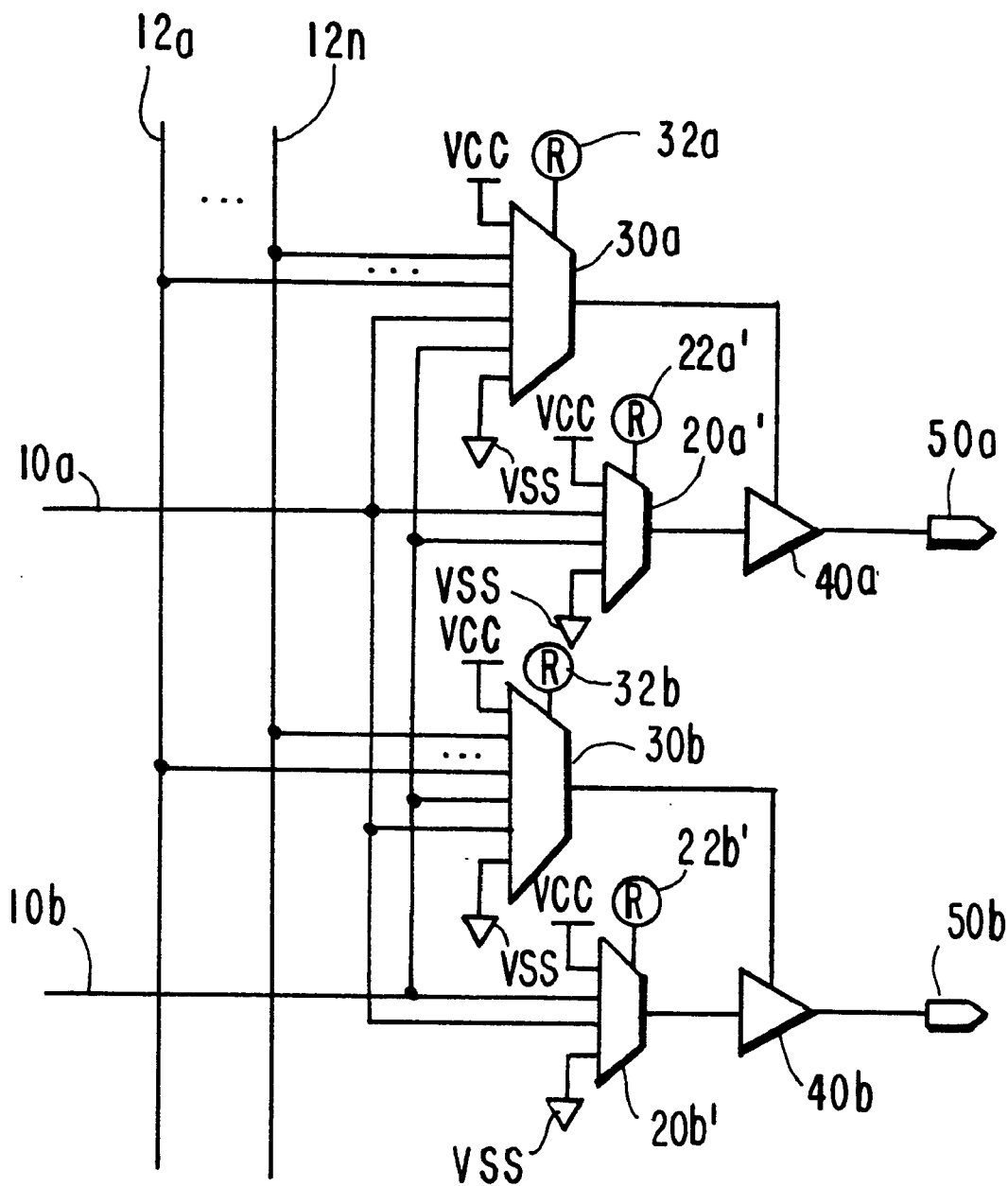
FIG. 2 is similar to FIG. 1 but shows an alternative embodiment of the invention.

FIG. 2 shows an alternative embodiment, which is generally similar to FIG. 1, except that in FIG. 2 each of PLCs 20a' and 20b' has two additional inputs. These two additional inputs are VCC (which is a fixed logic 1 signal) and VSS (which is a fixed logic 0 signal). PLCs 20a' and 20b' are respectively controlled by programmable FCEs 22a' and 22b' (similar to FCEs 22 in FIG. 1, but able to select from the greater number of inputs to PLCs 20a' and 20b'). With the modification shown in FIG. 2, the output signal for each pin 50a or 50b can be programmably tied to VCC or ground (VSS). This allows the implementation of open drain or open source drivers if desired.

As in the case of embodiments of the type shown in FIG. 1, embodiments of the type shown in FIG. 2 can have more than two output signals 10 in each group.

Figure 3:
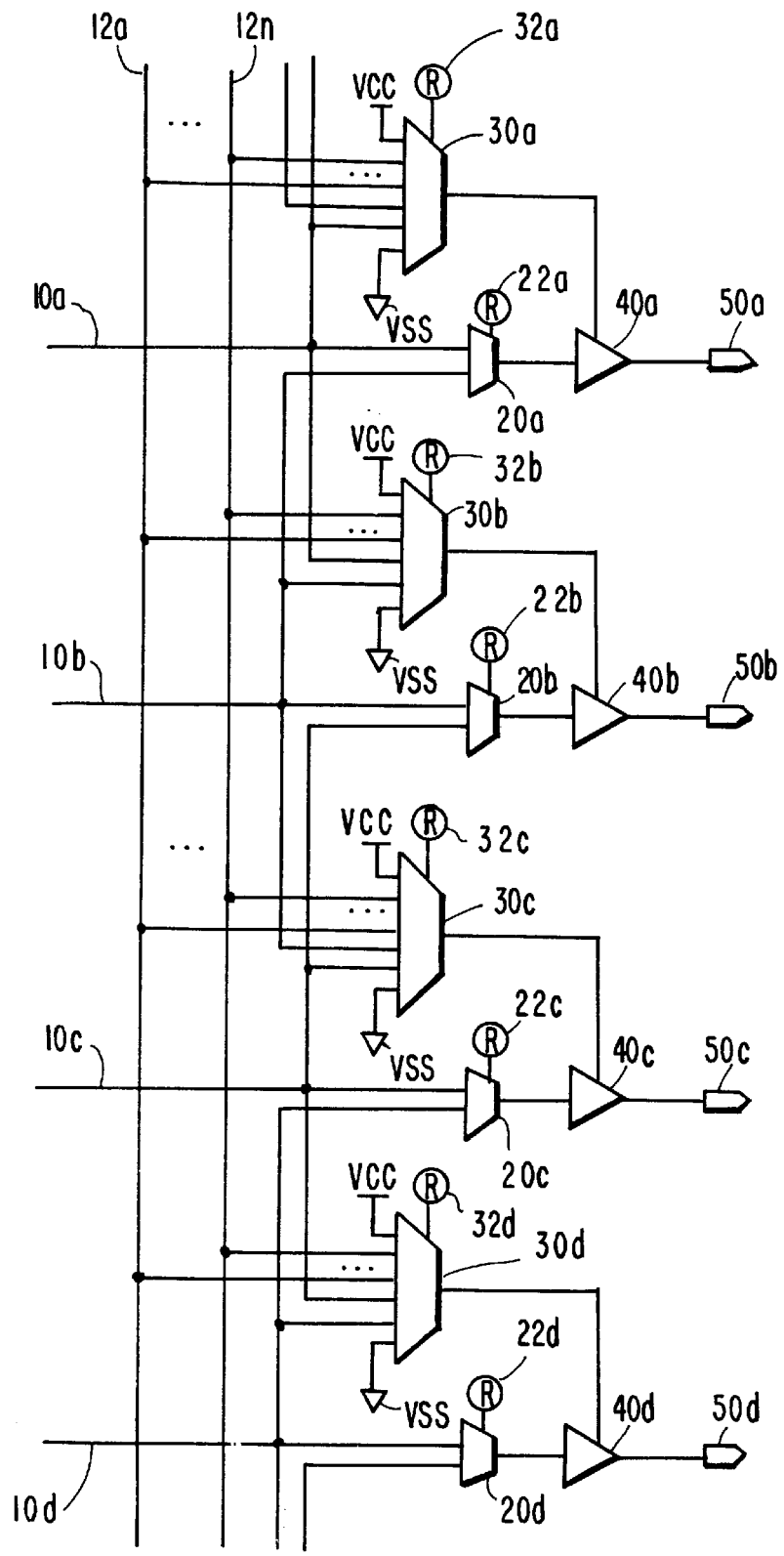
FIG. 3 is again similar to FIG. 1 but shows another alternative embodiment of the invention.

In the embodiments illustrated by FIGS. 1 and 2 the output signals 10 and associated circuitry are grouped in groups that are mutually exclusive of one another. (FIGS. 1 and 2 each show one such group of two output signals 10 and associated circuitry, but it has been explained that these groups can include larger numbers of output signals and associated circuitry if desired.) It is not necessary, however, for these groups to be the same for all purposes, or for these groups to be completely mutually exclusive of one another. For example, FIG. 3 shows an alternative embodiment in which each output signal 10 for a normally associated I/O pin 50 can also or alternatively be the output signal for the I/O pin 50 above the normally associated pin 50. For example, output signal 10b is applied to both PLC 20b and PLC 20a. Similarly, output signal 10c is applied to both PLC 20c and PLC 20b. Also in FIG. 3 each output signal 10 can be the OE signal for a normally associated output driver 40, and also or alternatively can be the OE signal for the output driver 40 below the normally associated output driver. Thus, for example, output signal 10a is applied to both PLC 30a and PLC 30b. Similarly, output signal 10b is applied to both PLC 30b and PLC 30c. (In the particularly preferred embodiments input/output pins 50a–50d are physically adjacent to one another in the circuitry that implements the programmable logic.)

The pattern of cross-connections between the circuitry for adjacent output signals 10 may continue above and below the representative circuitry that is shown in FIG. 3. The other inputs to PLCs 30 in FIG. 3 may be the same as the other inputs shown in FIGS. 1 and 2. (PLCs 20 in FIG. 3 may also have the other inputs shown in FIG. 2 if desired.) Except for the different arrangement of cross-connections between adjacent output signal circuits, the embodiment shown in FIG. 3 may operate generally as has been described above for FIGS. 1 and 2 (although the different cross-connection arrangements result in different sets of programmable options regarding how the various output signals 10 can be combined or otherwise employed for output and OE purposes).

Like the embodiments depicted in FIGS. 1 and 2, the embodiment shown in FIG. 3 gives each output signal 10 two different I/O pins 50 that it can drive, as well as two different OE signals that it can control. In FIG. 3, however, these two OE signals are not for the same two I/O pins that the output signals can drive. Instead, these two circuit aspects are only partly overlapping.

Other arrangements of partly overlapping cross-connections between output circuits are possible by combining and/or extending the principles illustrated by FIGS. 1–3. For example, in a modification of the arrangement shown in FIG. 3 each output signal 10 is applied to both the normally associated PLCs 20 and 30 and the PLCs 20 and 30 both above and below the normally associated PLCs. This fully pairs each output signal 10 with both the output signal above that signal and the output signal below that signal. Thus the resulting pairs of output signals overlap one another, rather than all being mutually exclusive as in FIGS. 1 and 2. In addition, this arrangement gives each output signal 10 access to three I/O pins 50, as well as the potential to be the OE signal for any or all of the drivers 40 for those three I/O pins.

As another example of a modification of arrangements of the general type shown in FIG. 3, each output signal 10 could be applied to its normally associated PLC 20 and to the two PLCs 20 above that PLC. And each output signal 10 could be applied to its normally associated PLC 30 and to the two PLCs 30 below that PLC. Still other arrangements within the scope of this invention will occur to those skilled in the art.

PLCs 20, 30, and 20' can be implemented in any of a variety of ways. For example, each PLC can be a switch or multiplexer or a plurality of switches or multiplexers for connecting any one of two more inputs to an output. Alternatively, each PLC can be a somewhat more complex element which is capable of performing logic (e.g., by programmably inverting one or more of its inputs or by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, FCEs 22, 32, and 22' as described above. (With certain PLC implementations (e.g., fuses and metal optional links) separate FCE devices are not required, so that in those cases the depiction of FCEs in the accompanying drawings merely indicates that the PLCs are programmable.) FCEs can also be implemented in any of several different ways. For example, FCEs can be SRAMs, DRAMs, first-in first-out ("FIFO") memories, EPROMS, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only and reprogrammable devices.

It will be understood that the foregoing is only illustrative of the principles of this invention, and that various modifications can be made by those skilled in the art without departing from the scope and spirit of the invention. For example, the so-called "global" OE signals 12*a–n* may in fact be available to only a fraction of the I/O pins 50 on the programmable logic device, while other similar signals are available to other fractions of those pins.

The invention claimed is:

1. A circuit for driving at least first and second input/output terminals on a semiconductor device having first and second output signal leads which provide respective first and second output signals, each input/output terminal connected to the output of an output driver circuit, and each of the output driver circuits having an output enable terminal and an input, the circuit comprising:

first programmable logic connector circuitry associated with each input/output terminal configured to receive said first and second output signals, each first programmable logic connector configured to programmably selectively connect the output signals to the input of said output driver circuitry; and second programmable logic connector circuitry associated with each input/output terminal configured to receive at least said first and second output signals, each second programmable logic connector configured to programmably selectively connect any of the output signals to any of said output enable terminals, and wherein said second programmable logic connector circuitries are substantially independent of one another such that selection of one of said output signals by any of said first or second programmable logic connector circuitries does not preclude another of said second programmable logic connector circuits from selecting another output signal.

2. The apparatus defined in claim 1 wherein said programmable logic connector circuitry further includes a source of fixed output enable potential, and wherein said second programmable logic connector circuitry comprises:

programmable logic connectors configured to selectively connect said source of fixed output enable potential to the output enable terminal of any of said output drivers.

3. The apparatus defined in claim 1 wherein said first programmable logic connector circuitry further includes a source of fixed output disable potential, and wherein said second programmable logic connector circuitry comprises:

programmable logic connectors configured to programmably connect said source of fixed output disable potential to the output enable terminal of any of said output drivers.

4. The apparatus defined in claim 1 wherein said programmable logic circuitry further comprises a source of fixed logic 1 potential, and wherein said first programmable logic connector circuitry comprises:

programmable logic connectors configured to programmably connect said source of fixed logic 1 potential to the input terminal of any of said output drivers.

5. The apparatus defined in claim 1 wherein said programmable logic circuitry further comprises a source of fixed logic 0 potential, and wherein said first programmable logic connector circuitry comprises:

programmable logic connectors configured to programmably connect said source of fixed logic 1 potential to the input terminal of any of said output drivers.

6. The apparatus defined in claim 1 wherein said first programmable logic connector circuitry includes a multiplexer.

7. The apparatus defined in claim 1 wherein said second programmable logic connector circuitry includes a multiplexer.

8. The apparatus defined in claim 1 further including control circuitry configured to direct the first programmable logic connector circuitry to selectively connect one of the output signals to the input of said driver circuitry.

9. The apparatus defined in claim 1 further including control circuitry configured to direct the second programmable logic connector circuitry to selectively connect one of the output signals to said output enable terminals.

10. Tri-statable input/output terminal circuitry for programmable logic which has a plurality of output signal leads, a plurality of input/output terminals, and a plurality of tri-statable output drivers, each of which is associated with a respective one of said input/output terminals and each of which has an input terminal, an output terminal connected to the associated input/output terminal, and an output enable terminal, for applying to said output terminal and said input/output terminal a signal indicative of a signal applied to said input terminal when said output driver is enabled by an output enable signal applied to said output enable terminal, comprising:

first programmable logic connector circuitry for associating a respective first subplurality of said output signal leads with the input terminal of each of said output drivers and for programmably selectively connecting any of the output signal leads in the associated first subplurality to said input terminal, the output signal leads that are thus associated with each input terminal including plural output signal leads that are thus associated with at least one other input terminal; and second programmable logic connector circuitry for associating a respective second subplurality of said output signal leads with the output enable terminal of each of said output drivers and for programmably selectively connecting any one of the output signal leads in the associated second subplurality to said output enable terminal, the output signal leads that are thus associated with each output enable terminal including plural output signal leads that are thus associated with at least one other output enable terminal, said first and second programmable logic connector circuitries being substantially independent of one another and non-blocking so that selection of any associated output signal lead by any of said first or second programmable logic connector circuitries does not preclude selection of any associated output signal lead by any other of said first and second programmable logic connector circuitries.

11. The apparatus defined in claim 10 wherein the first subplurality associated with the input terminal of each output driver is the same as the second subplurality associated with the output enable terminal of that output driver.

12. The apparatus defined in claim 10 wherein each of said first and second subpluralities consists of two of said output signal leads.

13. The apparatus defined in claim 10 wherein said programmable logic circuitry further includes a source of fixed output enable potential, and wherein said second programmable logic connector circuitry comprises:

programmable logic connectors configured to programmably connect said source of fixed output enable potential to the output enable terminal of any of said output drivers.

14. The apparatus defined in claim 10 wherein said programmable logic circuitry further includes a source of fixed output disable potential, and wherein said second programmable logic connector circuitry comprises:

programmable logic connectors configured to programmably connect said source of fixed output disable potential to the output enable terminal of any of said output drivers.

15. The apparatus defined in claim 10 wherein said programmable logic circuitry further comprises a source of fixed logic 1 potential, and wherein said first programmable logic connector circuitry comprises:

programmable logic connectors configured to programmably connect said source of fixed logic 1 potential to the input terminal of any of said output drivers.

16. The apparatus defined in claim 10 wherein said programmable logic circuitry further comprises a source of fixed ground potential, and wherein said first programmable logic connector circuitry comprises:

programmable logic connectors configured to programmably connect said source of fixed ground potential to the input terminal of any of said output drivers.

17. The apparatus defined in claim 10 wherein the first subplurality associated with the input terminal of each output driver includes an output signal lead that is not included in the second subplurality associated with the output enable terminal of that output driver.

18. The apparatus defined in claim 10 wherein the first subplurality associated with the input terminal of each output driver includes an output signal lead that is also included in the second subplurality associated with the output enable terminal of that output driver.

19. The apparatus defined in claim 10 wherein the second subplurality associated with the output enable terminal of each output driver includes an output signal lead that is not included in the first subplurality associated with the input terminal of that output driver.

20. Tri-statable input/output terminal circuitry or programmable logic which has a plurality of output signal leads, a plurality of input/output terminals, each of which is associated with a respective one of said output signal leads, and a plurality of tri-statable output drivers, each of which is associated with a respective one of said input/output terminals and each of which has an input terminal, an output terminal connected to the associated input/output terminal, and an output enable terminal, for applying to said output terminal and said input/output terminal a signal indicative of a signal applied to said input terminal when said output driver is enabled by an output enable signal applied to said output enable terminal, comprising:

first programmable logic connector circuitry associated with each of said input/output terminals configured to selectively use any of a first subplurality of said output leads as a source for a signal applied to said input terminal of the tri-statable output driver that is associated with that input/output terminal, said first subplurality including the output lead that is associated with that input/output terminal and the output signal lead that is associated with another of said input/output terminals; and second programmable logic connector circuitry associated with each of said input/output terminals configured to selectively use any of a second subplurality of said output leads as a source for a signal applied to said output enable terminal of the tri-statable output driver that is associated with that input/output terminal, said second subplurality including the output lead that is associated with that input/output terminal and the output signal lead that is associated with another of said input/output terminals, said first and second programmable logic connector circuitries being substantially independent of one another and non-blocking so that selection of any associated output signal lead by any of said first or second programmable logic connector circuitries does not preclude selection of any associated output signal lead by any other of said first and second programmable logic connector circuitries.

21. The apparatus defined in claim 20 wherein said first and second subpluralities associated with each of said input/output terminals include some output signal leads that are different for said first and second subpluralities.

22. The apparatus defined in claim 20 wherein said programmable logic circuitry further includes a source of fixed output enable potential, and wherein said second programmable logic connector circuitry associated with each of said input/output terminals comprises:

programmable logic connectors configured to selectively use said fixed output enable potential as a source for a signal applied to said output enable terminal of the tri-statable output driver that is associated with that input/output terminal.

23. The apparatus defined in claim 20 wherein said programmable logic circuitry further includes a source of fixed output disable potential, and wherein said second programmable logic connector circuitry associated with each of said input/output terminals comprises:

programmable logic connectors configured to selectively use said fixed output disable potential as a source for a signal applied to said output enable terminal of the tri-statable output driver that is associated with that input/output terminal.

24. The apparatus defined in claim 20 wherein said programmable logic circuitry further comprises a source of fixed logic 1 potential, and wherein said first programmable logic connector circuitry associated with each of said input/output terminals comprises:

programmable logic connectors configured to selectively use said fixed logic 1 potential as a source for a signal applied to the input terminal of the tri-statable output driver that is associated with that input/output terminal.

25. The apparatus defined in claim 20 wherein said programmable logic circuitry further comprises a source of fixed ground potential, and wherein said first programmable logic connector circuitry associated with each of said input/output terminals comprises:

programmable logic connectors configured to selectively use said fixed ground potential as a source for a signal applied to the input terminal of the tri-statable output driver that is associated with that input/output terminal.

26. The apparatus defined in claim 20 wherein the input/output terminals that can receive a signal from each of said first subpluralities via said first programmable logic connector circuitries and said tri-statable output drivers are physically adjacent to one another.

27. The apparatus defined in claim 20 wherein the input/output terminals having associated tri-statable output drivers that can receive an output enable terminal signal from each of said second subpluralities via said second programmable logic connector circuitries are physically adjacent to one another.

* * * * *